(12) United States Patent
Ebrahimzadeh et al.

(10) Patent No.: US 10,386,421 B2
(45) Date of Patent: Aug. 20, 2019

(54) ENERGY BASED BATTERY BACKUP UNIT TESTING

(71) Applicant: Facebook, Inc., Menlo Park, CA (US)

(72) Inventors: Soheil Ebrahimzadeh, Menlo Park, CA (US); Pierluigi Sarti, Milpitas, CA (US)

(73) Assignee: Facebook, Inc., Menlo Park, CA (US)

( * ) Notice: Subject to any disclaimer, the term of this patent is extended or adjusted under 35 U.S.C. 154(b) by 58 days.

(21) Appl. No.: 14/853,526

(22) Filed: Sep. 14, 2015

(65) Prior Publication Data

US 2017/0074946 A1     Mar. 16, 2017

(51) Int. Cl.
*G01R 31/392* (2019.01)
*G01R 31/385* (2019.01)
*G11C 5/14* (2006.01)
*G11C 29/02* (2006.01)
*G11C 29/56* (2006.01)

(52) U.S. Cl.
CPC ......... *G01R 31/392* (2019.01); *G01R 31/386* (2019.01); *G11C 5/141* (2013.01); *G11C 29/021* (2013.01); *G11C 29/56012* (2013.01); *G11C 2029/5602* (2013.01)

(58) Field of Classification Search
CPC .................................................. G01R 31/3679
USPC ...................................................... 324/426
See application file for complete search history.

(56) References Cited

U.S. PATENT DOCUMENTS

| | | | |
|---|---|---|---|
| 4,180,846 A | 12/1979 | Wilson et al. | |
| 5,196,987 A | 3/1993 | Webber et al. | |
| 5,579,234 A * | 11/1996 | Wiley | A61N 1/39 702/118 |
| 5,646,509 A * | 7/1997 | Berglund | G01R 19/16542 307/66 |
| 6,239,579 B1 * | 5/2001 | Dunn | G01R 31/3658 320/119 |
| 6,295,215 B1 | 9/2001 | Faria et al. | |
| 6,340,306 B1 | 1/2002 | Daoud et al. | |
| 6,347,950 B1 | 2/2002 | Yokoyama et al. | |
| 6,356,057 B1 * | 3/2002 | Shilo | G01R 31/40 320/127 |
| 7,500,867 B1 | 3/2009 | Doglio et al. | |
| 7,581,972 B2 | 9/2009 | Daamen et al. | |

(Continued)

OTHER PUBLICATIONS

U.S. Appl. No. 13/693,530 of Sarti, P. filed Dec. 4, 2012.

(Continued)

*Primary Examiner* — Richard Isla
*Assistant Examiner* — Johali A Torres Ruiz
(74) *Attorney, Agent, or Firm* — FisherBroyles, LLP

(57) ABSTRACT

Several embodiments perform battery backup unit (BBU) degradation testing. For example, a BBU testing system can be coupled to or part of a BBU. The BBU testing system can discharge the BBU by engaging a variable load to the BBU. The BBU testing system can monitor a discharge energy consumption over time as the BBU discharges until the discharge energy consumption reaches a specified amount of energy. The BBU testing system can determine a discharge time for the discharge energy consumption to reach the specified amount of energy. The BBU testing system can then compute a degradation state of the BBU based on the discharge time.

18 Claims, 7 Drawing Sheets

(56) References Cited

U.S. PATENT DOCUMENTS

| | | | |
|---|---|---|---|
| 7,880,438 B1* | 2/2011 | Cohen | G01R 31/3631 307/66 |
| 7,892,108 B2 | 2/2011 | Kuo | |
| 7,974,796 B2 | 7/2011 | Tamai | |
| 8,879,241 B2 | 11/2014 | Lu et al. | |
| 8,911,250 B2 | 12/2014 | Ehlen et al. | |
| 9,110,107 B2 | 8/2015 | Busca et al. | |
| 9,148,068 B2 | 9/2015 | Sarti et al. | |
| 9,320,166 B1 | 4/2016 | Marr et al. | |
| 9,331,409 B2 | 5/2016 | Taniguchi et al. | |
| 9,337,597 B2 | 5/2016 | Daamen et al. | |
| 9,489,024 B2 | 11/2016 | Chen et al. | |
| 9,552,031 B2 | 1/2017 | Sarti et al. | |
| 9,590,370 B1 | 3/2017 | Lee et al. | |
| 9,622,373 B1 | 4/2017 | Sarti | |
| 9,698,577 B2 | 7/2017 | Yi | |
| 2002/0171985 A1* | 11/2002 | Duffy | G06F 1/305 361/90 |
| 2003/0197428 A1 | 10/2003 | Hatton et al. | |
| 2005/0146223 A1 | 7/2005 | Kanouda et al. | |
| 2005/0162830 A1 | 7/2005 | Wortman et al. | |
| 2005/0221629 A1 | 10/2005 | Woellner et al. | |
| 2006/0120170 A1 | 6/2006 | Chen et al. | |
| 2009/0164820 A1 | 6/2009 | Abraham et al. | |
| 2011/0057724 A1 | 3/2011 | Pabon et al. | |
| 2012/0013186 A1 | 1/2012 | Sarti et al. | |
| 2012/0153720 A1 | 6/2012 | Chang et al. | |
| 2012/0248876 A1* | 10/2012 | Tamura | G01R 31/3679 307/66 |
| 2012/0290236 A1* | 11/2012 | Majima | G01R 31/362 702/63 |
| 2013/0058028 A1 | 3/2013 | Lu et al. | |
| 2013/0154365 A1 | 6/2013 | Sarti et al. | |
| 2013/0227309 A1 | 8/2013 | Jau et al. | |
| 2013/0279129 A1 | 10/2013 | Xie et al. | |
| 2014/0099806 A1 | 4/2014 | Ehlen et al. | |
| 2015/0036272 A1 | 2/2015 | Hirano et al. | |
| 2015/0177808 A1 | 6/2015 | Sarti et al. | |
| 2015/0180233 A1 | 6/2015 | Yamada et al. | |
| 2015/0180234 A1 | 6/2015 | Wang et al. | |
| 2015/0245531 A1 | 8/2015 | Meinecke et al. | |
| 2015/0268709 A1* | 9/2015 | Morning-Smith | G06F 1/28 307/23 |
| 2016/0187945 A1 | 6/2016 | Chen et al. | |
| 2016/0262282 A1 | 9/2016 | Li et al. | |
| 2016/0329689 A1 | 11/2016 | Yi et al. | |
| 2017/0094829 A1 | 3/2017 | Sarti | |
| 2017/0098956 A1 | 4/2017 | Sarti | |
| 2017/0164505 A1 | 6/2017 | Sarti | |
| 2017/0332510 A1 | 11/2017 | Sarti | |

OTHER PUBLICATIONS

U.S. Appl. No. 14/251,174 of Sarti, P. filed Apr. 11, 2014.
U.S. Appl. No. 14/873,585 of Sarti, P. filed Oct. 2, 2015.
U.S. Appl. No. 14/941,005 of Sarti, P. filed Nov. 13, 2015.
U.S. Appl. No. 14/958,648 of Sarti, P. filed Dec. 3, 2015.
Choi, et al.: "New 24-Pulse Diode Rectifier Systems for Utility Interface of High-Power AC Motor Drives." IEEE Transactions on Industry Applications, vol. 33, No. 2, Mar./Apr. 1997, 11 pages.
Non-Final Office Action dated Jun. 10, 2016, for U.S. Appl. No. 14/251,174 by Sarti. et al., filed Apr. 11, 2014.
Restriction Requirement dated Apr. 7, 2016 of U.S. Appl. No. 14/251,174 by Sarti, P., filed Apr. 11, 2014.
U.S. Appl. No. 15/153,348 of Sarti, P., et al., filed May 12, 2016.
Notice of Allowance dated Jun. 23, 2015, for U.S. Appl. No. 13/693,530 of Sarti, P. filed Dec. 4, 2012.
Corrected Notice of Allowability dated Feb. 24, 2017, for U.S. Appl. No. 14/941,005 of Sarti, P. filed Nov. 13, 2015.
Notice of Allowance dated Feb. 1, 2017 of U.S. Appl. No. 14/941,005 by Sarti, P., filed Nov. 13, 2015.
U.S. Appl. No. 15/377,957 by Sarti, P., filed Dec. 13, 2016.
Non-Final Office Action dated Sep. 22, 2017, for U.S. Appl. No. 14/958,648 by Sarti, P. filed Sep. 22, 2017.
Restriction Requirement dated Oct. 23, 2017, for U.S. Appl. No. 14/873,585 by Sarti. et al., filed Oct. 2, 2015.
Restriction Requirement dated Oct. 31, 2017, for U.S. Appl. No. 15/153,348 by Sarti. et al., filed May 12, 2016.

* cited by examiner

400 

```
Discharge a BBU in a BBU degradation test by electrically connecting a load to
the BBU
402
```

```
Measure electric current levels of the discharging and voltage levels across the
BBU
404
```

```
Compute continuously a discharge energy consumption as the BBU is
discharging
406
```

```
Monitor the discharge energy consumption over time as the BBU discharges
until the discharge energy consumption reaches a specified amount of energy
408
```

```
Close the switch that electrically connects the load to the BBU when the
discharge energy consumption reaches the specified amount of energy
410
```

ENERGY BASED BATTERY BACKUP UNIT TESTING

BACKGROUND

A data center is a practical solution for cloud computing or large-scale application services or data services in information technology (IT) operations. One of the infrastructural challenges of a data center is powering computer server racks in the data center. For example, it is sometimes difficult to operate a power system continuously because of potential power surges and power outages (e.g., including black outs or brown outs). A data center can provide a backup power solution to its computer server racks. For example, the backup power solution can include a backup power generator that provides sustainable power after a power outage occurs. The backup power generator oftentimes cannot become fully operational immediately. After a power outage and before the backup power generator becomes fully operational, a battery backup unit (BBU) can be used to provide direct current (DC) power.

A BBU, however, does not last forever. Through repeated use, the BBU degrades and eventually stores insufficient energy. When this happens, the BBU can no longer be relied upon. Hence, it is a technical challenge to accurately determine whether or not the data center can rely on a BBU during power surges and outages. The health of a BBU is difficult to determine. Conventionally, the health of a BBU is determined via a battery test that discharges the BBU to a predetermined voltage under constant current and constant power. Under this testing process, each BBU test records the time it takes to discharge the BBU to the predetermined voltage. The comparison of the discharge time is used to determine whether the BBU has deteriorated beyond a threshold.

The conventional battery test requires a constant rate of discharge, and hence can only be performed when the BBU is isolated from a variable load (e.g., computer servers and other electronic components). The conventional battery test may also damage the BBU by fully or substantially fully discharging the BBU.

BRIEF DESCRIPTION OF THE DRAWINGS

FIG. 4 is a flow diagram of a method of discharging a BBU for a BBU degradation test, in accordance with various embodiments.

Figure 1A:
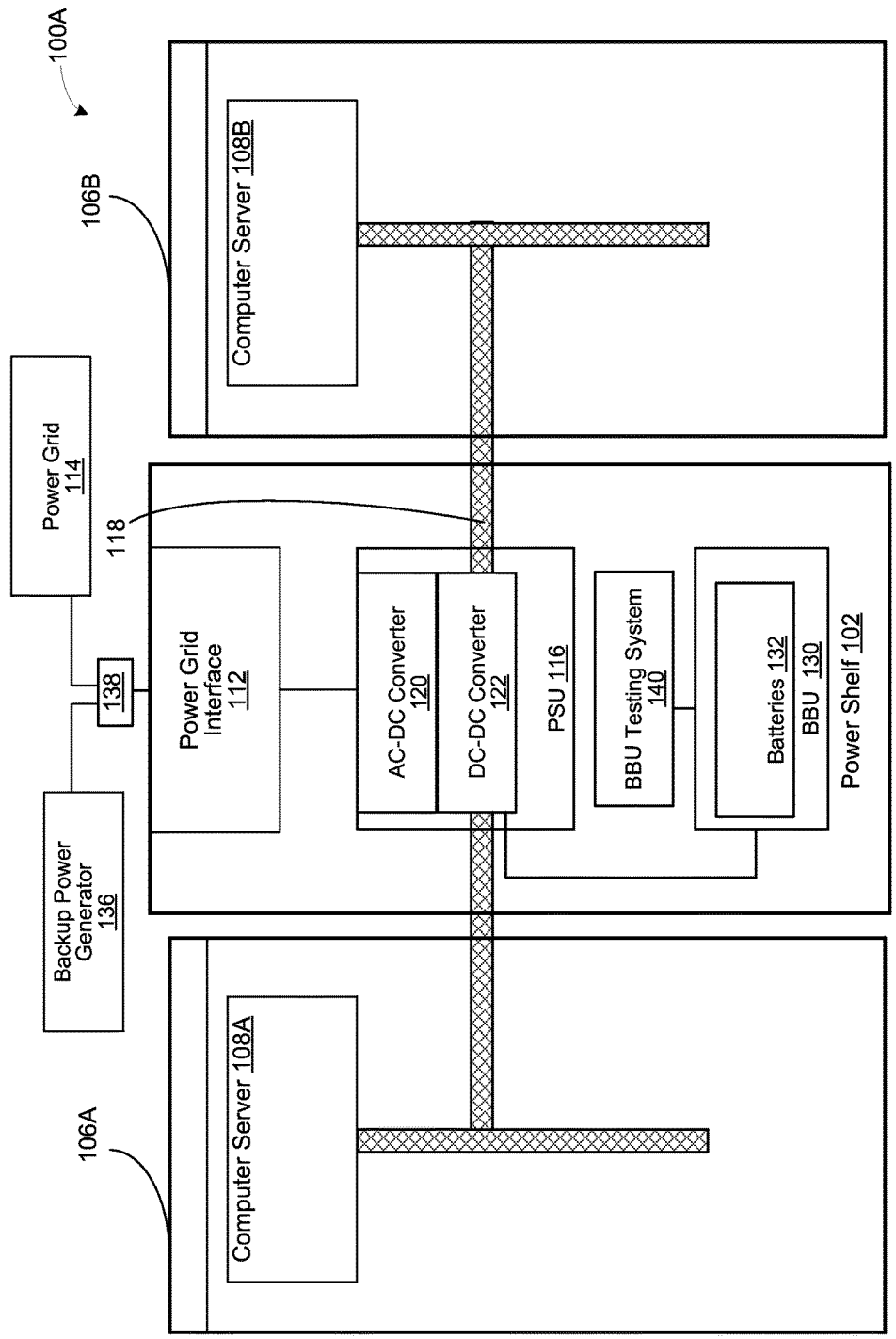
FIG. 1A is a block diagram illustrating a first example of a comprehensive power system for one or more server racks in a data center, in accordance with various embodiments.

The figures depict various embodiments of the disclosure for purposes of illustration only. One skilled in the art will readily recognize from the following discussion that alternative embodiments of the structures and methods illustrated herein may be employed without departing from the principles of the invention described herein.

DETAILED DESCRIPTION

Embodiments are disclosed for a BBU testing system (e.g., including one or more circuits) capable of estimating deterioration of a BBU (e.g., including one or more lithium-ion batteries or other types of rechargeable batteries) for one or more computing devices (e.g., computer servers or computer server racks) in a data center. For example, the BBU can be part of a power shelf or part of a computer server rack in the data center. The BBU testing system can advantageously perform BBU testing despite having a variable load coupled to a target BBU for degradation testing. The BBU testing system can use the variable load to discharge the target BBU during the degradation testing.

In several embodiments, the BBU testing system discharges the target BBU to a predetermined energy threshold (e.g., a constant amount of discharged energy) instead of a predetermined voltage level or charge level. The predetermined energy threshold can be specified in Joules. This mechanism enables a BBU test to not rely on a constant rate of discharge, and hence enable the BBU testing system to use a variable load instead of a constant load to drain the target BBU. Because a computer server as a power consumer is a variable load, the target BBU can continue to provide power to the computer server despite undergoing a degradation test. The target BBU can also undergo the degradation test without completely or substantially completely depleting its charge.

In some embodiments, the battery testing system dynamically computes how much energy is discharged by monitoring a power curve over a time period or a specified duration. The battery testing system can determine the power curve by measuring the voltage drop across the target BBU and the electric current discharged from the target BBU. The BBU testing system can integrate the power curve over time to dynamically compute energy discharged during the BBU test. When the discharged energy crosses the predetermined energy threshold, the BBU test can decouple the target BBU from the variable load.

In some embodiments, a BBU test yields a binary conclusion of whether or not a target BBU is sufficiently functional (e.g., whether it requires replacement). In some embodiments, a BBU test yields a gradient scale of degradation level proportional to a life expectancy of a target BBU. The binary conclusion can be made by having one or more attributes of the target BBU satisfy one or more criteria (e.g., cross or fail to cross a specified threshold value). For example, the predetermined energy threshold can be chosen as the amount of energy required to sustain the maximum load (e.g., a specified percentage or even all of the computer servers and components that the target BBU supports) of the target BBU for the time it takes for a backup generator to be fully operational in the event of a power outage (herein referred to as "$T_{threshold}$"). In one example, the battery testing system makes the binary conclusion by determining whether the time it takes to discharge the target BBU (herein referred to as "$T_{test}$") is exceeds the $T_{threshold}$. In this example, when $T_{test}$ is more than (more than or equal to) $T_{threshold}$, the battery testing system can determine that the target BBU is no longer sufficiently functional.

In another example, the battery testing system makes the binary conclusion by measuring a voltage level (herein referred to as "$V_{test}$") when the target BBU finishes discharging (e.g., when the discharged energy crosses the predetermined energy threshold). The battery testing system can determine that the target BBU is no longer sufficiently functional when $V_{test}$ is lower than a specified voltage threshold value (herein referred to as "$V_{min}$"). $V_{min}$ can be the minimum voltage of an input voltage that a DC-to-DC converter requires to convert the input voltage to a DC voltage that is usable by the load of the target BBU.

The BBU test can also yield a rate of deterioration based on a comparison of parameters determined from multiple BBU test sessions. In one example, for each BBU test session, the battery testing system can characterize the target BBU after the variable load is removed. For example, the battery testing system can wait until the voltage of the target BBU settles to measure an open circuit voltage of the target BBU (herein referred to as "$V_{settle}$"). The battery testing system can compute an impedance and/or resistance increase of the target BBU based on the difference between $V_{test}$ and $V_{settle}$. The rate of deterioration of the target BBU may be proportional to the rate of resistance change between BBU test sessions. In another example, the battery testing system can measure the time it takes for the voltage of the target BBU to settle (herein referred to as "$T_{settle}$." In some embodiments, the battery testing system can determine the rate of deterioration of the target BBU based on the time it takes for the voltage of the target BBU to settle.

Turning now to the figures, FIG. 1A is a block diagram illustrating an example of a comprehensive power system 100A for one or more server racks (e.g., a server rack 106A and a server rack 106B, collectively as the "server racks 106") in a data center, in accordance with various embodiments. In several embodiments, the comprehensive power system 100A is capable of providing uninterrupted power to the server racks 106. In the illustrated example, the comprehensive power system 100A is embodied within a power shelf 102 outside of the server racks 106.

Figure 1B:
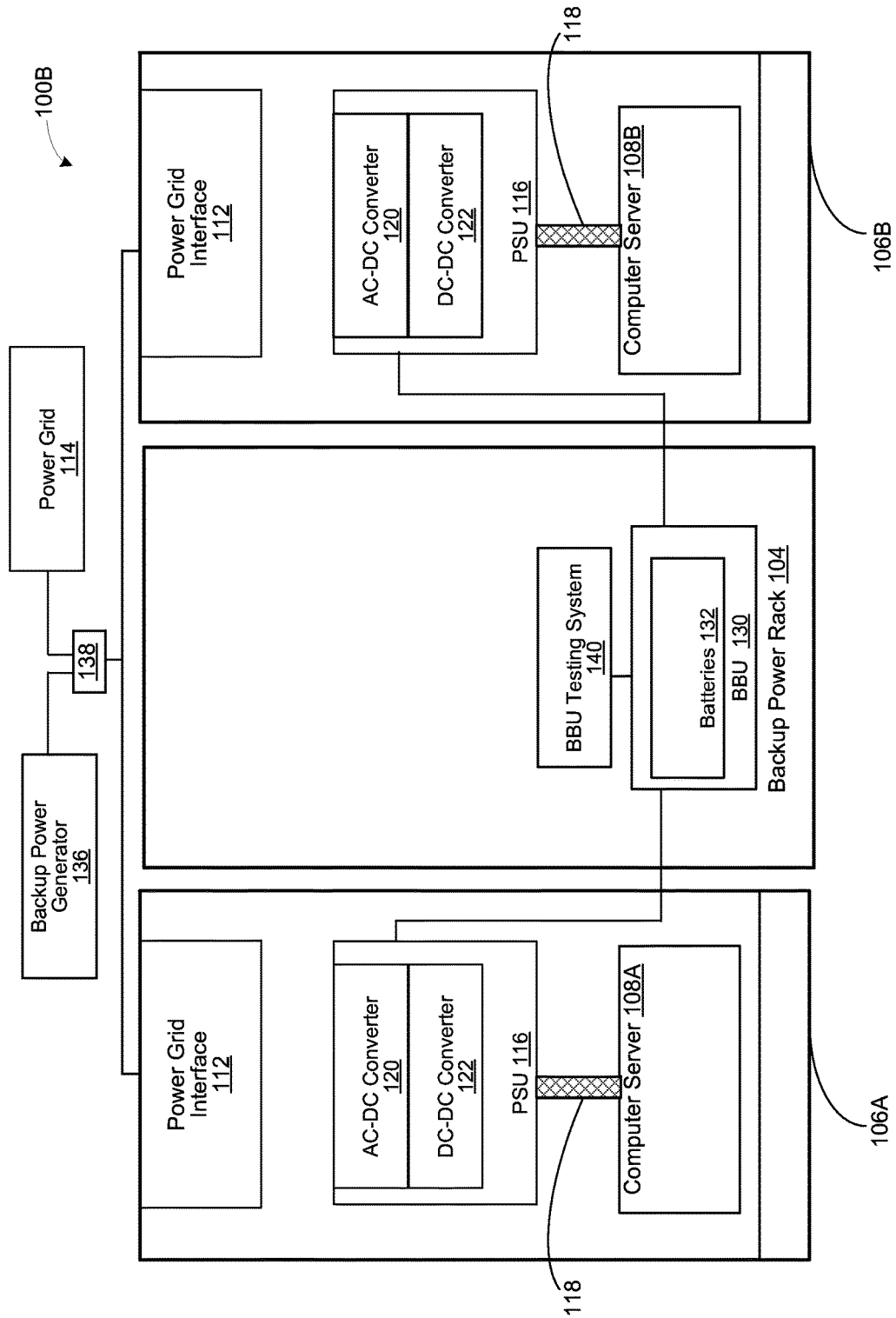
FIG. 1B is a block diagram illustrating a second example of a comprehensive power system for the server racks in a data center, in accordance with various embodiments.

In some embodiments, the comprehensive power system 100A has separate physical components (e.g., some outside of the server racks 106 and some inside of the server racks 106). For example, FIG. 1B is a block diagram illustrating a second example of a comprehensive power system 100B for the server racks 106 in a data center, in accordance with various embodiments. FIG. 1B illustrates a power supply portion of the comprehensive power system 100B in the server racks 106 and the backup power portion of the comprehensive power system 100B in a backup power rack 104.

Figure 1C:
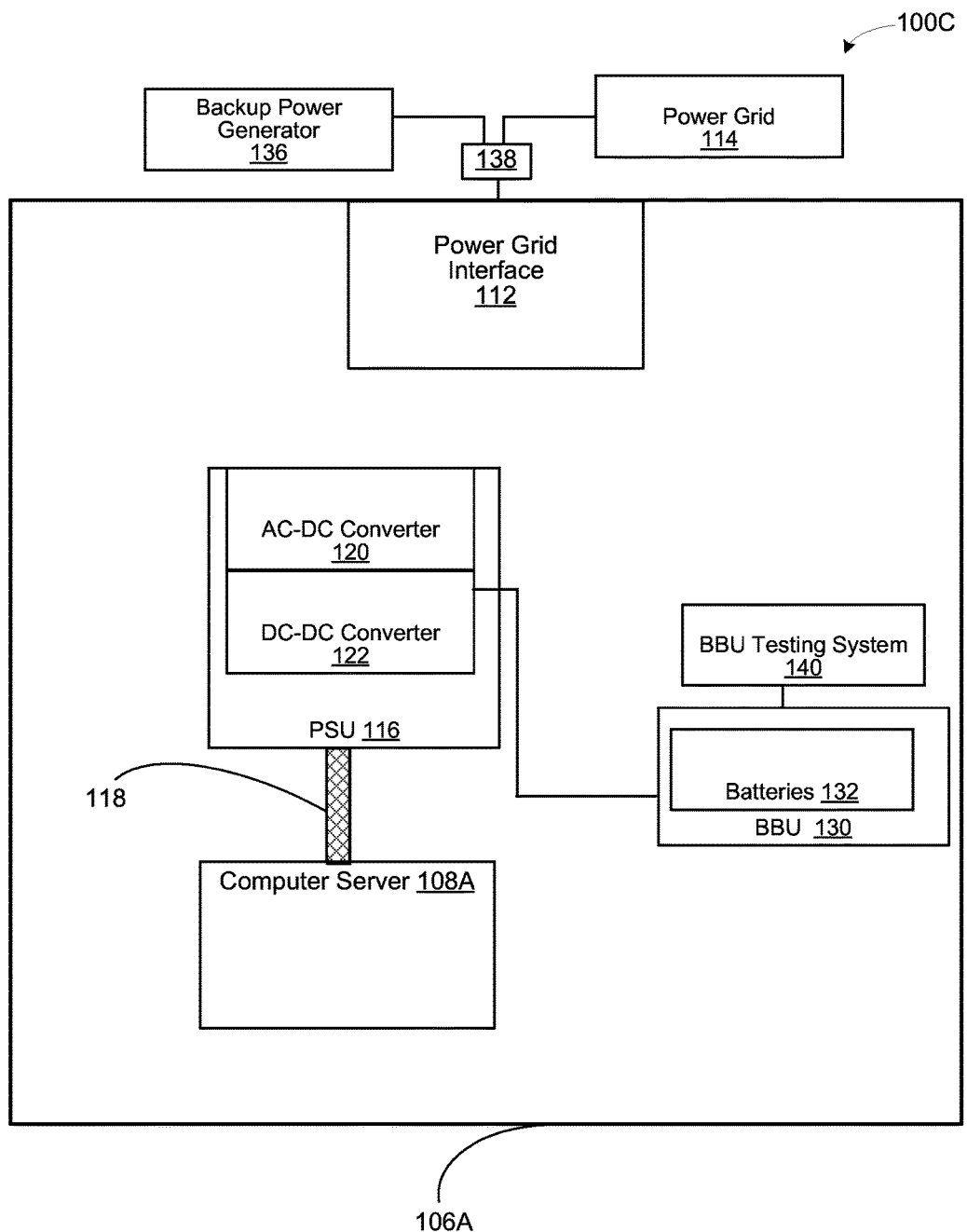
FIG. 1C is a block diagram illustrating a third example of a comprehensive power system for the server racks in a data center, in accordance with various embodiments.

In some embodiments, the comprehensive power system 100A can be a module within one of the server racks 106 or within a computer server (e.g., a computer server 108A in the server rack 106A or a computer server 108B in the server rack 106B) within a server rack. For example, FIG. 1C is a block diagram illustrating a third example of a comprehensive power system 100C for the server racks 106 in a data center, in accordance with various embodiments. The components of the comprehensive power system 100C are integrated within a single server rack (e.g., the server rack 106A as illustrated).

The following components are described in reference to the first example of the comprehensive power system 100A, although it is understood that the same components can be applied to other examples of the comprehensive power system. The comprehensive power system 100A can include a power grid interface 112. The power grid interface 112 can receive an alternating current (AC) input from a power grid 114. In some embodiments, the AC input can be a three-phase electric power.

The comprehensive power system 100A can include at least one power supply unit (PSU) 116. The PSU 116 converts the power provided by the power grid interface 112 to provide a power rail 118 that the server racks 106 can draw from. In some embodiments, the PSU 116 includes an AC-to-DC converter 120 to convert the AC input power from the power grid interface 112 into a first DC voltage. In some embodiments, the AC-to-DC converter 120 is implemented in the power grid interface 112.

The PSU 116 can include a DC-to-DC converter 122 that converts the first DC voltage of the AC-to-DC converter 120 to a second DC voltage usable by electronic components within the server racks 106. In some embodiments, the power grid interface 112 and the PSU 116 are housed in the same physical component within the comprehensive power system 100A.

When the power grid provides uninterrupted power, the power grid interface 112, the PSU 116, and/or other power conversion or delivery components (not illustrated) can provide sufficient power to keep the electronic components within the server racks 106 operational. However, when a power outage occurs, the comprehensive power system 100A relies on one or more backup power components. For example, the comprehensive power system 100A includes at least a BBU 130 and a backup power generator 136. The BBU 130 includes one or more batteries 132 that provide enough power to keep the electronic components within the server racks 106 running for a short period of time (e.g., a few seconds or minutes). The backup power generator 136 can provide enough power to keep the electronic components within the server racks 106 running for a much longer period of time (e.g., multiple minutes or even hours). A power switch 138 can draw AC power from the backup power generator 136 when the power grid 114 fails to provide sufficient power. However, the backup power generator 136 can take some time to become fully operational (e.g., capable of providing stable and uninterrupted power to the electronic components within the server racks 106). As an example, a diesel backup generator may take a minute or longer before providing stable power. Accordingly, the BBU 130 can provide power after the power grid 114 fails, but before the backup power generator 136 becomes fully operational.

The comprehensive power system 100A includes a BBU testing system 140. In some embodiments, the BBU testing system 140 is part of the BBU 130. In some embodiments, the BBU testing system 140 is outside of the BBU 130 (e.g., as a separate component). The BBU testing system 140 can perform degradation testing of the BBU 130 according to a schedule or based on randomized testing. The degradation testing can involve discharging a specified amount of energy from the BBU 130. In some embodiments, the degradation testing can include measuring a stable open circuit voltage of the BBU 130 after the discharge. In some embodiments, the degradation testing can include measuring how long it takes for the open circuit voltage of the BBU 130 to settle.

Figure 2:
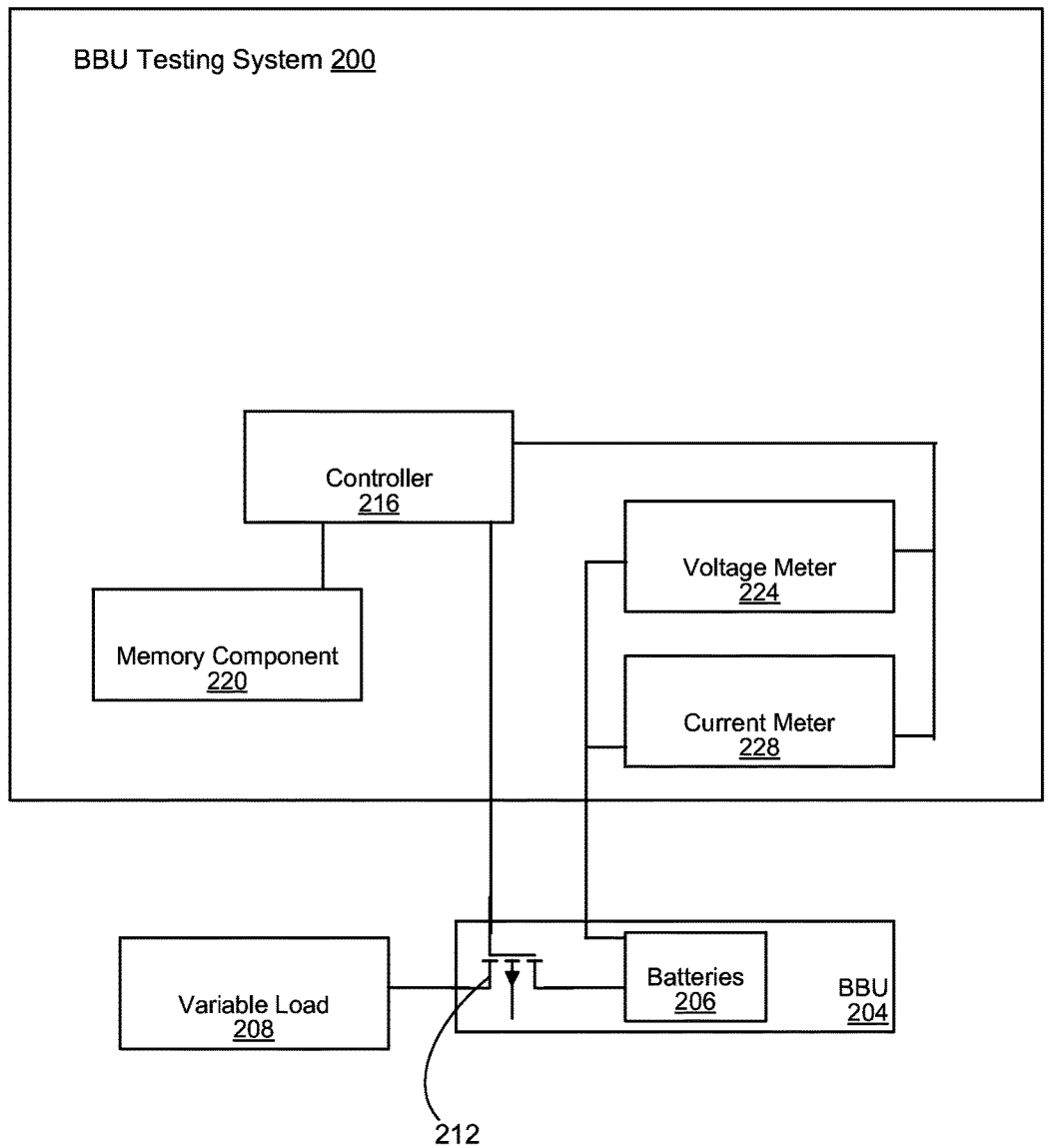
FIG. 2 is a block diagram illustrating a BBU testing system, in accordance with various embodiments.

FIG. 2 is a block diagram of a BBU testing system 200, in accordance with various embodiments. The BBU testing system 200 can be coupled to or be part of a BBU 204 (e.g., the BBU 130 of FIGS. 1A-1C) that includes one or more batteries 206. The BBU 204 can be connected to a variable load 208 (e.g., electronic components within at least one of the server racks 106 of FIGS. 1A-1C) via a load switch 212 (e.g., in the BBU 204 or outside of the BBU 204).

The BBU testing system 200 can include a controller 216 configured to perform the BBU tests. The controller 216 can store the results of the BBU tests in a memory component 220. In some embodiments, the controller 216 is configured to perform one or more BBU tests on the BBU 204 according to a test schedule. For example, the test schedule can be stored in the memory component 220. In some embodiments, the controller 216 is configured to randomly perform the BBU tests. In some embodiments, the controller 216 is configured to perform a BBU test in response to a particular event (e.g., a specified period of time after a power outage).

The controller 216 can be coupled to a voltage meter 224, a current meter 228, the load switch 212, or any combination thereof. The controller 216 can send commands to the load switch 212 to electrically couple or decouple the batteries 206 from the variable load 208. The controller 216 can also electrically couple the voltage meter 224 to the batteries 206 to measure the voltage (e.g., open circuit or closed circuit) across the batteries 206 as a whole (e.g., across the BBU 204) or individually. Likewise, the controller 216 can electrically couple the current meter 228 to the batteries 206 to measure the electric current drawn from the batteries 206 as a whole (e.g., across the BBU 204) or individually.

Figure 3:
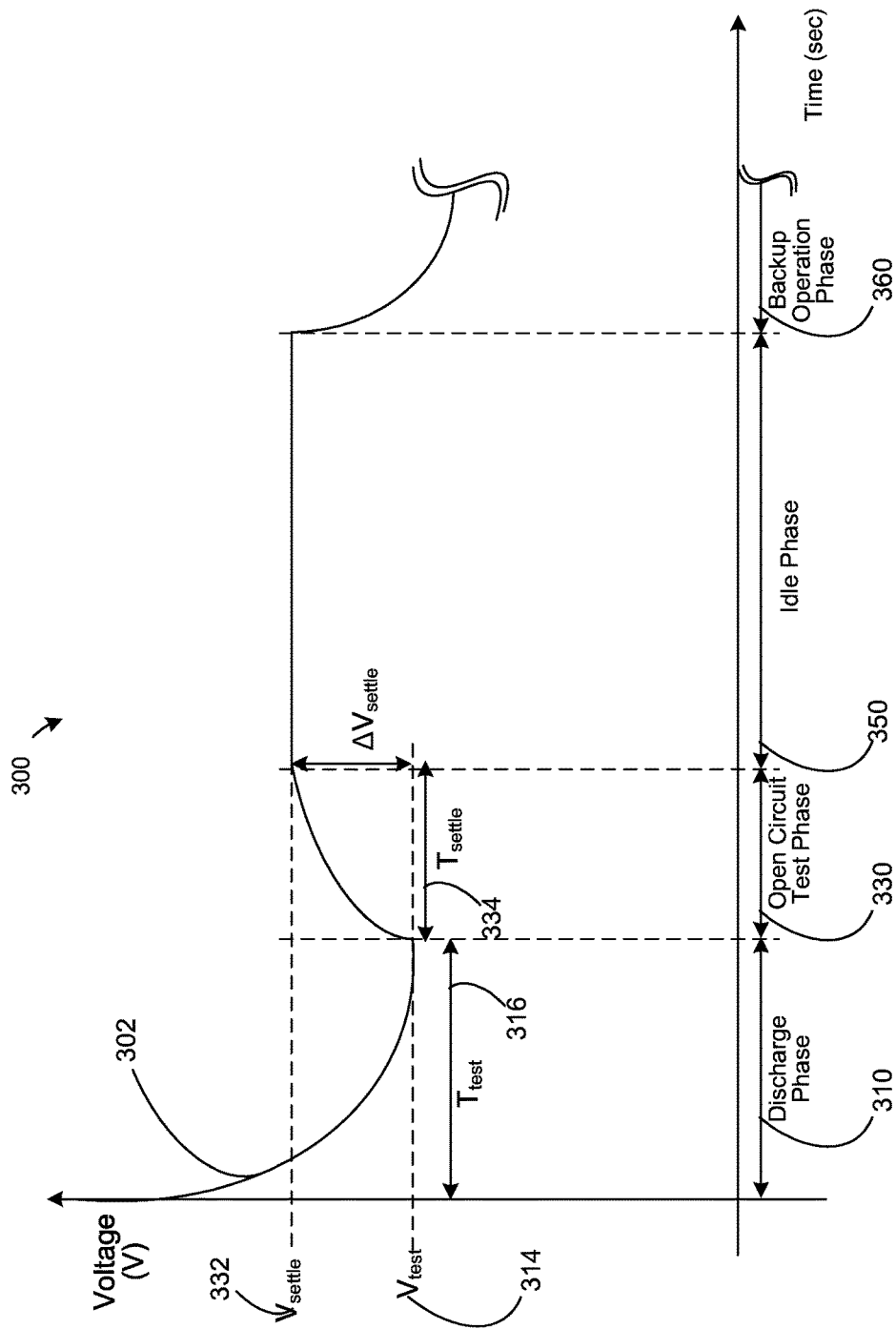
FIG. 3 is a graph diagram illustrating a voltage level curve of a BBU during a BBU degradation test, in accordance with various embodiments.

FIG. 3 is a graph diagram 300 illustrating a voltage level curve 302 of a BBU (e.g., the BBU 130 of FIGS. 1A-1C or the BBU 204 of FIG. 2) during a BBU degradation test, in accordance with various embodiments. The battery test can be administered by a BBU testing system (e.g., the BBU testing system 140 of FIGS. 1A-1C or the BBU testing system 200 of FIG. 2). In a discharge phase 310 of the battery test, the BBU is electrically coupled to a variable load (e.g., one or more server racks to which the BBU supports). During the discharge phase 310, the voltage level curve 302 drops quickly initially and then slowly tapers out into a plateau where the voltage level curve 302 is substantially flat. In several embodiments, this plateau represents the operating range of the BBU where the voltage of the BBU remains substantially constant. The discharge phase 310 lasts until an energy consumption of the discharge reaches a specified amount (e.g., as described in further detail below at block 408 of FIG. 4, herein referred to as "energy$_{test}$"). At the end of the discharge phase 310, the BBU testing system can disconnect the variable load from the BBU.

The BBU testing system can measure a closed circuit voltage 314 of the BBU at the end of the discharge. In FIG. 3, the closed circuit voltage 314 is labeled as "$V_{test}$." For example, the closed circuit voltage 314 is measured prior to disconnecting the variable load from the BBU. The BBU testing system can also measure a discharge time 316, labeled as $T_{test}$ in FIG. 3. Either or both of the measurements can be used as a metric to determine a degradation state of the BBU.

After the discharge phase 310, the BBU testing system removes the variable load from the BBU and thus enters an open circuit test phase 330. During the open circuit test phase 330, the voltage level curve 302 may rise and return to a stable open circuit voltage 332, labeled as "$V_{settle}$" in FIG. 3. The voltage difference (e.g., labeled as "$\Delta V_{settle}$" in FIG. 3) between the stable open circuit voltage 332 and the closed circuit voltage 314 can be used to determine the internal resistance of the batteries in the BBU. For example, the BBU testing system can measure a settlement time 334 (e.g., labeled as $T_{settle}$ in FIG. 3) for the voltage level curve 302 to reach the stable open circuit voltage 332. Using the Ohm's law equation (voltage=current×resistance), the power law equation (power=current×voltage) and the energy consumption equation (energy=power*time), the BBU testing system can compute the internal resistance as the square of the voltage difference multiplied by the settlement time 334 divided by the specified amount of energy consumption (e.g., $\Delta V_{settle} * \Delta V_{settle} * T_{settle}/\text{energy}_{test}$). A change in the internal resistance of the batteries is an indicator (e.g., proportional) of the rate of degradation of the BBU.

After the open circuit test phase 330, the BBU degradation test is finished. For example, the BBU can enter an idle phase 350 until it is used in operation as a backup (e.g., during a backup operation phase 360) or during another degradation test.

FIG. 4 is a flow diagram of a method 400 of discharging a BBU for a BBU degradation test, in accordance with various embodiments. At block 402, a BBU testing system (e.g., the BBU testing system 200 of FIG. 2) can discharge a BBU in a BBU degradation test by electrically connecting a load to the BBU (e.g., by turning on a load switch) to engage the load. The load can be a variable load (e.g., an electrical load that drains the BBU at varying rates of discharge). For example, the variable load can be one or more server racks (e.g., including one or more computer servers and/or related devices) for which the BBU provides backup power. Devices and components of the server racks can continue to operate during the BBU degradation test.

While discharging the BBU, the BBU testing system can measure, at block 404, electric current levels of the discharging and voltage levels across the BBU. At block 406, the BBU testing system can compute (e.g., continuously overtime) a discharge energy consumption as the BBU is discharging. For example, the BBU testing system can compute the discharge energy consumption by continuously integrating the electric current levels multiplied by the voltage levels. To simulate continuous integration, the BBU testing system can perform a summation of the product of the electric current levels and the corresponding voltage levels.

At block 408, the BBU testing system can monitor the discharge energy consumption over time as the BBU discharges until the discharge energy consumption reaches a specified amount of energy. In some embodiments, the specified amount of energy corresponds to an amount of energy required to sustain a maximum usage by the load for the maximum amount time. At block 410, the BBU testing system can close the switch that electrically connects the load to the BBU when the discharge energy consumption reaches the specified amount of energy.

Figure 5:
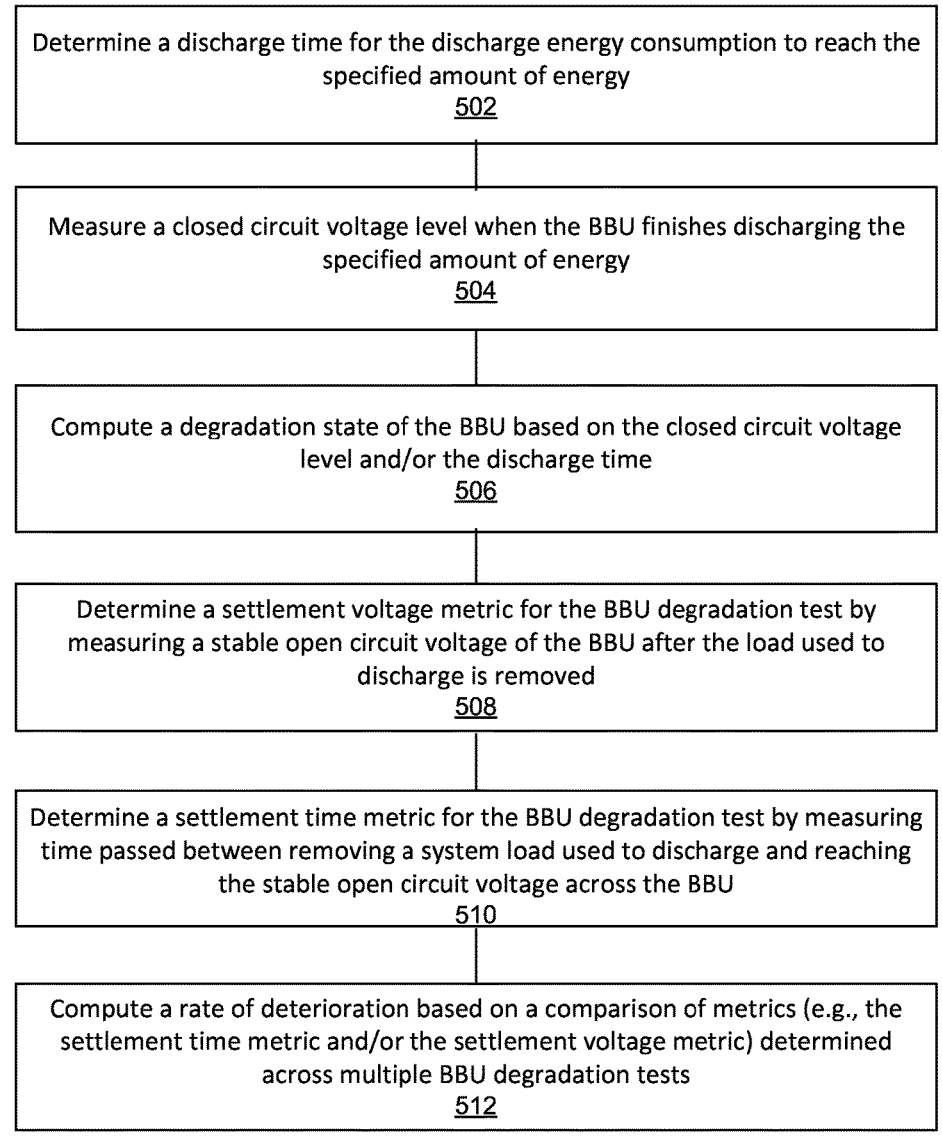
FIG. 5 is a flow diagram of a method of completing the BBU degradation test of FIG. 4 after the discharge, in accordance with various embodiments.

FIG. 5 is a flow diagram of a method 500 of completing the BBU degradation test of FIG. 4 after the discharge, in accordance with various embodiments. At block 502, the BBU testing system can determine a discharge time for the discharge energy consumption to reach the specified amount of energy. For example, the BBU testing system can determine the discharge time by starting a clock counter when the discharging begins and stopping the clock counter when the discharging ends. The discharge time is set by the clock counter when the discharging ends.

At block 504, the BBU testing system can measure a closed circuit voltage level when the BBU finishes discharging the specified amount of energy. At block 506, the BBU testing system can compute a degradation state of the BBU. The degradation state can be computed based on the discharge time and/or the closed circuit voltage level. In one example, the BBU testing system determines that the BBU has degraded when the discharge time is higher than a time threshold. In some embodiments, the time threshold corresponds to maximum amount of time to get a backup generator (e.g., the backup power generator 136 of FIGS. 1A-1C) running to produce stable and sufficient power to the load that the BBU supports.

In one example, the BBU testing system can determine that the BBU has degraded when the closed circuit voltage level is lower than a voltage threshold. In some embodiments, the voltage threshold is a minimum voltage that a DC-to-DC converter (e.g., the DC-to-DC converter 122 of FIGS. 1A-1C) requires as an input to convert to a DC voltage that is usable by a computing device for which the BBU provides backup power.

At block 508, the BBU testing system can determine a settlement voltage metric for the BBU degradation test by measuring a stable open circuit voltage of the BBU after the load used to discharge is removed. At block 510, the BBU testing system can determine a settlement time metric for the BBU degradation test by measuring time passed between removing the load used to discharge and reaching the stable open circuit voltage across the BBU. At block 512, the BBU testing system can compute a rate of deterioration based on a comparison of metrics (e.g., the settlement time metric and/or the settlement voltage metric) determined across multiple BBU degradation tests.

While processes or methods are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. In addition, while processes or blocks are at times shown as being performed in series, these processes or blocks may instead be performed in parallel, or may be performed at different times.

Some embodiments of this disclosure have other aspects, elements, features, and steps in addition to or in place of what is described above. These potential additions and replacements are described throughout the rest of the specification.

What is claimed is:

1. A method, comprising:
    discharging a battery backup unit (BBU) in a BBU degradation test by electrically coupling the BBU to a variable load;
    monitoring a discharge energy consumption, in Joules or a functionally equivalent measurement unit, over time while the BBU is discharging until the discharge energy consumption reaches a specified amount of energy, wherein monitoring the discharge energy consumption comprises:
        measuring electric current levels of the discharging and voltage levels across the BBU as the BBU discharges; and
        integrating the electric current levels multiplied by the voltage levels over time to dynamically calculate the discharge energy consumption;
    measuring a discharge time for the discharge energy consumption to reach the specified amount of energy and a closed circuit voltage across the BBU when the discharge energy consumption reaches the specified amount of energy;
    electrically decoupling the BBU from the variable load when the discharge energy consumption reaches the specified amount of energy;
    monitoring, after electrically decoupling the BBU from the variable load, the voltage levels across the BBU at least until the voltage levels across the BBU stabilize;
    measuring, when the voltage levels across the BBU stabilize, an open circuit voltage across the BBU and a settlement time for the voltage levels across the BBU to stabilize; and
    determining at least one of a degradation state or a rate of deterioration of the BBU based on one or more of the measured discharge time, the measured closed circuit voltage, the measured open circuit voltage, or the measured settlement time.

2. The method of claim 1, wherein measuring the discharge time includes starting a clock counter when the discharging begins and stopping the clock counter when the discharging ends.

3. The method of claim 1, wherein during the discharging, the variable load drains the BBU at varying rates of discharge.

4. The method of claim 3, wherein the variable load includes a computing device for which the BBU provides backup power and wherein the computing device continues to operate during the BBU degradation test.

5. The method of claim 1, wherein determining at least one of the degradation state or the rate of deterioration of the BBU includes determining that the BBU has degraded when the measured closed circuit voltage is lower than a voltage threshold.

6. The method of claim 5, wherein the voltage threshold is a minimum voltage that a DC-to-DC converter requires as an input to convert to a DC voltage that is usable by a computing device for which the BBU provides backup power.

7. The method of claim 1, wherein determining at least one of the degradation state or the rate of deterioration of the BBU includes determining that the BBU has degraded when the measured discharge time is higher than a time threshold.

8. The method of claim 7, wherein the time threshold corresponds to maximum amount of time to get a backup generator running to produce stable and sufficient power to a system load that the BBU supports.

9. The method of claim 8, wherein the specified amount of energy corresponds to an amount of energy required to sustain a maximum usage by the system load for the maximum amount of time.

10. The method of claim 1, wherein determining the rate of deterioration of the BBU is based on a comparison of metrics determined across multiple BBU degradation tests.

11. The method of claim 10, wherein determining the rate of deterioration of the BBU comprises computing an internal resistance of the BBU based on the specified amount of energy, the measured closed circuit voltage, the measured open circuit voltage, and the measured settlement time.

12. The method of claim 10, wherein determining the degradation state of the BBU is based on at least one of the measured closed circuit voltage or the measured discharge time.

13. The method of claim 1, wherein the variable load both does not have predefined discharge parameters and does not produce a constant discharge rate.

14. A battery backup unit (BBU) test system, comprising:
    a controller configured to initiate a BBU degradation test by engaging a variable load to discharge the BBU;
    a current meter configured to measure electric current levels of the BBU; and
    a voltage meter configured to measure voltage levels across the BBU;
    wherein the controller is configured to:
        monitor a discharge energy consumption, in Joules or a functionally equivalent measurement unit, over time as the BBU is discharged until the discharge energy consumption reaches a specified amount of energy, wherein monitoring the discharge energy consumption comprises:
measuring the electric current levels of the discharging and the voltage levels across the BBU as the BBU discharges; and
integrating the electric current levels multiplied by the voltage levels over time to dynamically calculate the discharge energy consumption;
measure a discharge time for the discharge energy consumption to reach the specified amount of energy and a closed circuit voltage across the BBU when the discharge energy consumption reaches the specified amount of energy;
electrically decouple the BBU from the variable load when the discharge energy consumption reaches the specified amount of energy;
monitor, after electrically decoupling the BBU from the variable load, the voltage levels across the BBU at least until the voltage levels across the BBU stabilize;
measure, when the voltage levels across the BBU stabilize, an open circuit voltage across the BBU and a settlement time for the voltage levels across the BBU to stabilize; and
determine at least one of a degradation state or a rate of deterioration of the BBU based on one or more of the measured discharge time, the measured closed circuit voltage, the measured open circuit voltage, or the measured settlement time.

15. The BBU test system of claim 14, wherein the controller is configured to determine the degradation state based on at least one of the measured closed circuit voltage or the measured discharge time.

16. The BBU test system of claim 14, wherein the controller is configured to determine the rate of deterioration based on at least one of the measured open circuit voltage or the measured settlement time.

17. The BBU test system of claim 16, further comprising a data storage memory, wherein the controller is configured to store at least one of the measured open circuit voltage or the measured settlement time in the data storage memory for a subsequent comparison.

18. A backup power system for one or more computer servers, comprising:
a battery backup unit (BBU);
a server rack as a power consumer that relies on the BBU for backup power;
a load switch to engage or disengage the server rack from the BBU; and
a BBU testing system configured to:
monitor a discharge energy consumption, in Joules or a functionally equivalent measurement unit, over time as the BBU is discharging via the load switch until the discharge energy consumption reaches a specified amount of energy, wherein monitoring the discharge energy consumption comprises:
measuring electric current levels of the discharging and voltage levels across the BBU as the BBU discharges; and
integrating the electric current levels multiplied by the voltage levels over time to dynamically calculate the discharge energy consumption;
measure a discharge time for the discharge energy consumption to reach the specified amount of energy and a closed circuit voltage across the BBU when the discharge energy consumption reaches the specified amount of energy;
electrically decouple the BBU via the load switch when the discharge energy consumption reaches the specified amount of energy;
monitor, after electrically decoupling the BBU via the load switch, the voltage levels across the BBU at least until the voltage levels across the BBU stabilize;
measure, when the voltage levels across the BBU stabilize, an open circuit voltage across the BBU and a settlement time for the voltage levels across the BBU to stabilize; and
determine at least one of a degradation state or a rate of deterioration of the BBU based on one or more of the measured discharge time, the measured closed circuit voltage, the measured open circuit voltage, or the measured settlement time.

* * * * *